United States Patent [19]

Hulme et al.

[11] Patent Number: 5,407,297
[45] Date of Patent: Apr. 18, 1995

[54] CIRCUIT BOARD RETAINER HAVING A SPRING BODY MEMBER

[75] Inventors: Conrad Hulme, Arcadia; Raymond G. Bond, Long Beach, both of Calif.

[73] Assignee: EG&G Birtcher, Inc., El Monte, Calif.

[21] Appl. No.: 22,059

[22] Filed: Feb. 24, 1993

[51] Int. Cl.⁶ .............................................. F16B 13/04
[52] U.S. Cl. .................................. 403/409.1; 403/24; 403/374; 439/327
[58] Field of Search ...................... 403/409.1, 374, 373, 403/24, 368; 361/704, 707, 715, 719, 720, 801; 439/327, 325; 414/75; 165/80.1, 80.2, 80.3

[56] References Cited

U.S. PATENT DOCUMENTS

| | | | |
|---|---|---|---|
| 4,131,933 | 12/1978 | Agard et al. | 361/415 |
| 4,298,904 | 11/1981 | Koenig | 361/386 |
| 4,414,605 | 11/1983 | Chino et al. | 361/715 X |
| 4,415,212 | 11/1983 | DePillo | 339/17 C |
| 4,480,287 | 10/1984 | Jensen | 361/715 X |
| 4,701,984 | 10/1987 | Wyckoff | 24/573 |
| 4,707,764 | 11/1987 | Cogan | 361/390 |
| 4,721,155 | 1/1988 | McNulty | 164/80.2 |
| 4,751,963 | 6/1988 | Bui et al. | 165/80.2 |
| 4,823,951 | 4/1989 | Colomina | 206/328 |
| 4,826,447 | 5/1989 | Forker et al. | 439/328 |
| 4,869,680 | 9/1989 | Yamamoto et al. | 439/327 |
| 4,914,552 | 4/1990 | Kecmer | 361/415 |
| 4,953,059 | 8/1990 | McNulty | 361/386 |
| 4,976,358 | 12/1990 | Stickel et al. | 211/41 |
| 5,036,428 | 7/1991 | Brownhill et al. | 361/386 |
| 5,156,647 | 10/1992 | Ries | 411/75 |
| 5,253,963 | 10/1993 | Ries | 403/409.1 X |
| 5,290,122 | 3/1994 | Hulme | 403/409.1 X |

FOREIGN PATENT DOCUMENTS 1238276  6/1986  U.S.S.R. ............................ 361/720

OTHER PUBLICATIONS

EG&G Birtcher, El Monte, Calif., 1992 Catelog.

*Primary Examiner*—Eric K. Nicholson
*Assistant Examiner*—Harry C. Kim
*Attorney, Agent, or Firm*—Wolf, Greenfield & Sacks

[57] ABSTRACT

A retainer for holding a circuit board between spaced surfaces comprises a plurality of wedge-shaped members slideably mounted end-to-end on a rod. At least one member is designed and constructed to receive and retain the rod. In a preferred embodiment, the one member includes a pair of opposing walls defining a longitudinal entrance through which the rod is inserted. The opposing walls are constructed to permit movement of the rod through the longitudinal entrance only when a force in a proper direction above a predetermined threshold is applied to the rod.

16 Claims, 4 Drawing Sheets

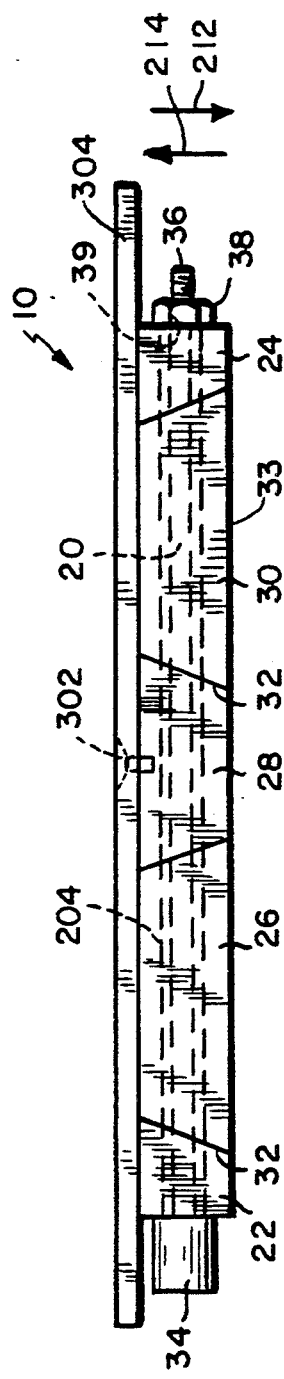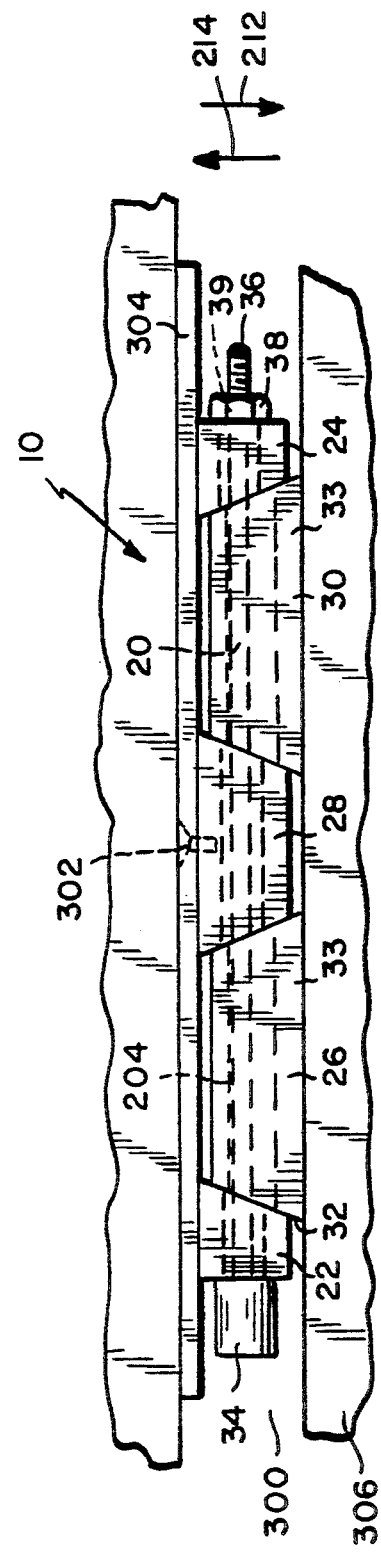

CIRCUIT BOARD RETAINER HAVING A SPRING BODY MEMBER

FIELD OF THE INVENTION

The present invention relates to retainer assemblies for clamping a printed circuit board between spaced surfaces of a chassis and more particularly to a retainer having slideable members including a longitudinal entrance for receiving and retaining a rod.

BACKGROUND OF THE INVENTION

Electronic equipment often employs printed circuit boards or cards. These cards typically are mounted in a chassis or card rack by stacking the cards in row alignment with one another. Row alignment in the chassis is defined by slotted or spaced surfaces within or on the chassis, with each circuit board placed in a slot or between a pair of spaced surfaces. A retainer may be provided in the chassis slot to captivate a card positioned therein. Many applications for such retainers require high performance that will captivate a printed circuit board under the most extreme shock and vibration conditions such as those encountered by spacecraft or military aircraft.

Typical printed circuit board retainers are described in U.S. Pat. Nos. 4,823,951 and 5,036,428, the teachings of which are incorporated herein by reference. Such retainers comprise a partially threaded screw or rod and a plurality of members slideably mounted in an end-to-end relationship on the rod. The members disposed on the rod have wedge-shaped end portions which are engagable with one another. The wedge-shaped end portions serve to move at least one of the members in a transverse direction relative to the rod when the members are moved towards one another along the rod. Such movement may be achieved by providing the rod with screw threads to engage and move the distal-most member when the rod is rotated. Alternatively, the movement may result from the action of a lever assembly used to draw the rod away from the distal-most member, thereby pulling that member toward its companions.

Commonly, the rod in prior art retainers is threaded at one end to engage with mating threads on a nut attached to the end-most sliding member mounted on the rod. The opposite end of the rod includes a portion that may be engaged by a tool to allow the rod to be rotated. In so doing, the members are moved toward one another as the threaded rod is rotated in the tightening direction.

The transverse direction in which the member is moved acts to engage a clamping surface of that member against an edge of the printed circuit board. The opposite edge of the board is thereby forced into contact with, and clamped against, a spaced surface fixedly connected to or integral with the chassis in which the board is to be mounted. Typically, the spaced surface fixedly connected to the chassis is the wall of a housing that is screwed or rivetted to the chassis.

The housings of the prior art are mounted (e.g., rivetted or screwed) to the chassis during the manufacture process, or more commonly, by the end user during the application. If the housing is to be mounted by the end user, the retainers and housings are shipped unassembled, although these components can be shipped assembled with instructions to remove the retainer from the housing before mounting the housing to the chassis. Following attachment of the housing to the chassis, the end user must re-assemble the retainer in the housing by inserting a first end of the retainer rod through an opening in a housing end wall, positioning the slideable members on the rod, screwing the first rod end into a nut attached to the end-most sliding member mounted on the rod, and passing the first rod end through a second housing end wall opening.

After mounting the housing and re-assembling the retainer, the end user must install the circuit board between the retainer and a housing side wall. Because it is desirable to maximize the number of circuit boards held in the chassis, retainer housings are designed with a minimum distance between each pair of side walls. As a result, insertion of the circuit board into the space between the retainer and one of the side walls is hampered or prevented if the retainer members are not maintained in proper alignment on the rod. Further, the use of excessive force to install the circuit board between the retainer and housing side wall causes excessive wear and tear on the retainer and the circuit board and may cause breaking of the circuit board. Such misalignment may occur, for example, by rotation of the members on the rod when the retainer is in a relaxed position. One approach to solving the problem of misalignment has been to provide a spring bias, such as that disclosed in U.S. Pat. No. 4,823,951, between the rod and the slideable member, the bias being provided by a leaf spring mounted on at least one of the slideable members.

A need therefore exists for a retainer assembly which eliminates or substantially reduces the labor-intensive, time-consuming process for mounting the retainer to a chassis. The improved retainer would facilitate initial installation, inspection, repair and/or replacement of the slideable members on the retainer rod and would also facilitate installation of the board between the retainer and a side wall of the housing.

SUMMARY OF THE INVENTION

In accordance with the purposes of the invention as embodied and described herein, the retainer for holding a printed circuit board between spaced surfaces includes a plurality of members slideably mounted in an end-to-end relationship on a rod. At least one of the slideable members includes an internal longitudinal channel having a transverse dimension that is greater than the outer diameter of the rod, to thereby permit movement of the member along a transverse path relative to the rod. The member which moves transversely relative to the rod and the members adjacent to that member each have end portions engagable with one another. These end portions are shaped to force the transversely movable member in a transverse direction upon forcing of the members toward one another along the rod. With sufficient movement in the transverse direction, the member engages and clamps the circuit board against its adjacent spaced surface.

The rod and slideably mounted members are received in a recess defined by a housing bottom wall and a pair of housing side walls. Since space typically is at a premium in the chassis, the recess is designed to have as small a width as possible to permit mounting the retainer and circuit board therein. Accordingly, to facilitate installation of the board between the retainer and one of the housing side walls, the slideable members preferably include alignment means to maintain alignment of the members on the rod. The alignment means can be the inner surface of a slideable member, which surface is designed and constructed to press against and captivate the rod, thereby preventing misalignment by inhibiting rotation of the member on the rod.

In contrast to the retainers of the prior art, the slideable members of the instant invention include a longitudinal entrance to the internal longitudinal channel and inhibiting means for permitting movement of the rod through the longitudinal entrance only when a force in a proper direction above a predetermined threshold is applied to the rod. In a preferred embodiment, the longitudinal entrance is defined by a pair of opposing channel walls that are spaced apart by a distance that is less than the outer diameter of the rod. In a preferred embodiment, the opposing channel walls include lips which extend into the longitudinal entrance, thereby inhibiting movement of the rod into and out of the longitudinal channel. Accordingly, the channel walls are formed of a material having sufficient elasticity to permit insertion of the rod between the opposing walls. In an alternative embodiment, the opposing channel walls include a spring clip for inhibiting movement of the rod into and out of the channel. The spring clip is formed of a material having sufficient elasticity to permit insertion of the rod through the channel entrance.

Additional features and advantages of the invention will be set forth in the description which follows, making reference to the accompanying figures.

BRIEF DESCRIPTION OF THE DRAWINGS

FIG. 1A is a top view of a first embodiment of a circuit board retainer of the present invention, shown in its unexpanded configuration;

FIG. 1B is a top view of the embodiment of FIG. 1a, shown in its expanded configuration;

DETAILED DESCRIPTION OF THE INVENTION

Figure 2A:
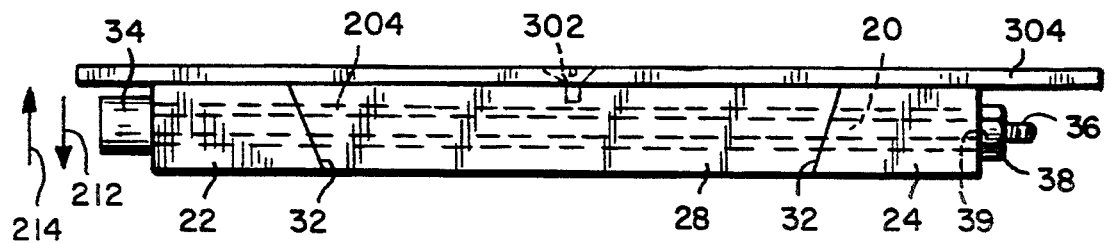
FIG. 2A is a top view of a second embodiment of a circuit board retainer of the present invention, shown in its unexpanded configuration.
Figure 2B:
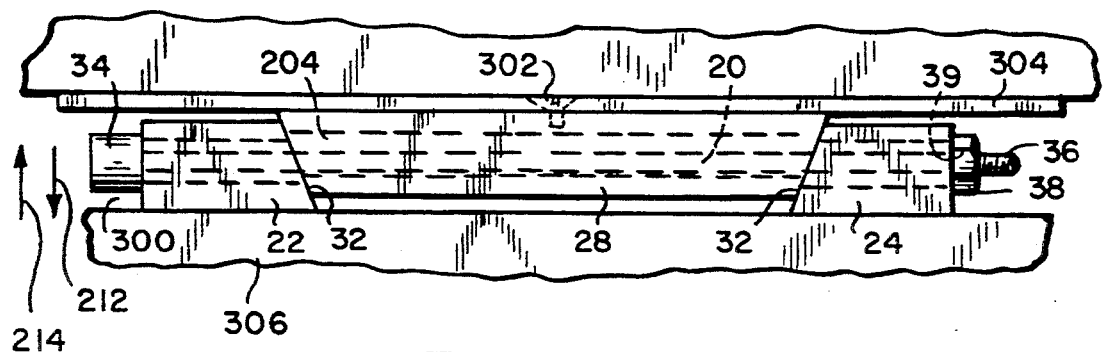
FIG. 2B is a top view of the embodiment of FIG. 2a, shown in its expanded configuration.

FIGS. 1 and 2 are top views of a retainer 10 including a rod 20 upon which are mounted a plurality of slideable members. The retainer is held in a slot 300 (shown in FIGS. 1B and 2B) of a housing that is mounted on a chassis according to methods known to those of skill in the art. The retainer can be directly attached to the housing or to the circuit board, e.g., by rivetting or screwing an intermediate member 28 to the housing or board, or by other attachment means known to one of skill in the art. FIGS. 1 and 2 illustrate a screw 302 used to attach intermediate member 28 to a circuit board 304.

The plurality of slideable members includes end members 22 and 24, and intermediate members 26, 28 and 30 (FIG. 1). Intermediate members 26 and 30 are disposed adjacent to member 28 and respective end members 22 and 24. Each end of intermediate members 26, 28 and 30 is configured with an inclined (wedge-shaped) surface 32 which mates with and slideably contacts the inclined surface 32 of an adjacent member. Similarly, each end member 22, 24 includes an inclined surface 32 formed on one end thereof which mates with and slideably contacts one end of respective intermediate members 26 and 30. Each intermediate member 26, 30 further includes a clamping surface 33 for engaging a portion of the housing wall (described below).

Retainer 10 includes a means for selectively applying a force to move slideable members 22, 24, 26, 28 and 30 towards one another along the rod. According to the embodiment of FIGS. 1 and 2, the means for selectively applying a force to the slideable members includes a head 34 formed on one end of rod 20, and screw threads 36 formed on the opposite end of the rod. A nut 38 having internal threads 39 is fixedly attached to end member 24 and aligned with the channel in end member 24 through which rod 20 protrudes. The threads 39 of nut 38 comprise the mating threads with which rod threads 36 engage. In this manner, as the rod threads engage with mating threads, the rod rotates and advances through internal longitudinal channel 204 of the slideable members, thereby causing the inclined wedge-shaped surfaces 32 of respective members to "ride up" on the mating surfaces 32 of an adjacent member as the members are moved toward one another along the rod. In an alternative embodiment, end member 24 includes threads to engage the threaded portion 36 of the rod 20, thereby eliminating the need for nut 38.

Comparison of FIGS. 1A and 1B shows the movement of the slideable members relative to one another as the assembly is moved between its unlocked (relaxed) state of FIG. 1A and locked (compressed) state of FIG. 1B. As rod 20 is rotated or drawn in a first direction to engage rod threads 36 with mating threads 39 of nut 38, the slideable members are forced to move towards one another on the rod, thereby forcing intermediate members 26 and 30 to advance in transverse direction 212. As a result, the clamping surfaces of the transversely moving members engage and press against a housing wall 306, thereby securing the circuit board in housing slot 300. As would be apparent to one of skill in the art, the retainer alternatively can be attached to the housing wall such that actuating the retainer causes transversely moving members 26 and 30 to press against circuit board 304.

A second embodiment of the circuit board retainer is illustrated in FIGS. 2A and 2B, which embodiment includes end members 22, 24 and intermediate member 28, i.e., a three-member wedge. The intermediate member is attached by screw 302 to circuit board 304. Comparison of FIGS. 2A and 2B shows the movement of end members 22, 24 relative to intermediate member 28 as the assembly is moved between its unlocked (relaxed) state of FIG. 2A and locked (compressed) state of FIG. 2B. As described above in reference to the five-member wedge embodiment of FIGS. 1A and 1B, rotation of rod 20 to engage rod threads 36 with mating threads 39 of nut 38, forces the end members to move towards the intermediate member on the rod, thereby forcing end members 22, 24 to advance in transverse direction 212. As a result, the clamping surfaces of the transversely moving end members engage and press against housing wall 306, thereby securing the circuit board in housing slot 300.

Figure 3A:
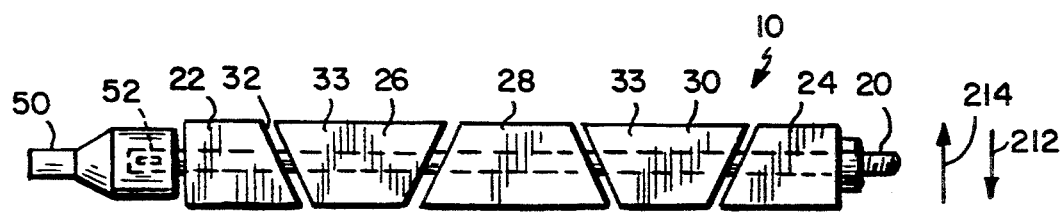
FIG. 3A is a top view of a third embodiment of a circuit board retainer of the present invention, shown in its unexpanded configuration.
Figure 3B:
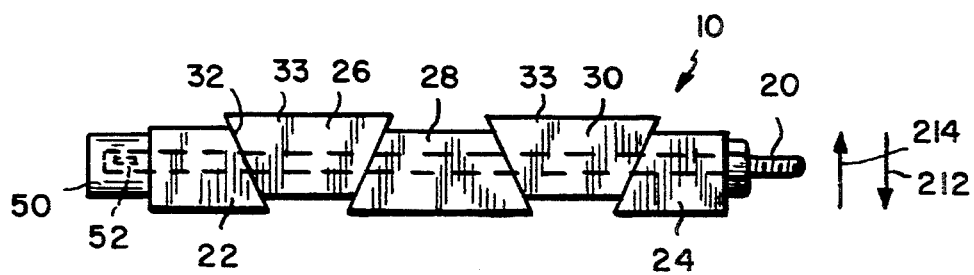
FIG. 3B is a top view of the circuit board retainer of FIG. 3A, shown in its expanded configuration.

A third embodiment of the circuit board retainer is illustrated in FIGS. 3A and 3B. According to this embodiment, an L-shaped lever 50 is provided to engage one end of the rod using a pivot pin 52. As lever 50 is pivoted in a direction into the figure, rod 20 is drawn backward with a result similar to that of tightening the screw in the embodiments of FIGS. 1 and 2.

In a preferred embodiment, each slideable member includes a pair of opposing side walls 200 attached to a bottom wall 202, e.g. a U-shaped member (FIGS. 4-7). The walls form a first junction 218 and a second junction 220 at the intersection of the side walls and the bottom wall. The combination of the side walls and bottom wall define a longitudinal channel 204 having a transverse dimension greater than the outer diameter of the rod. The internal longitudinal channel of intermediate members 26 and 30 is designed and constructed to have a dimension so as to permit movement of these members in transverse direction 212 when the retainer is actuated. End members 22 and 24 are also configured with an internal longitudinal channel, although the channel formed in these members need not be formed with as great a transverse dimension as the channels of intermediate members 26 and 30, since members 22 and 24 are not required to move transversely relative to the rod during expansion.

Figure 6:
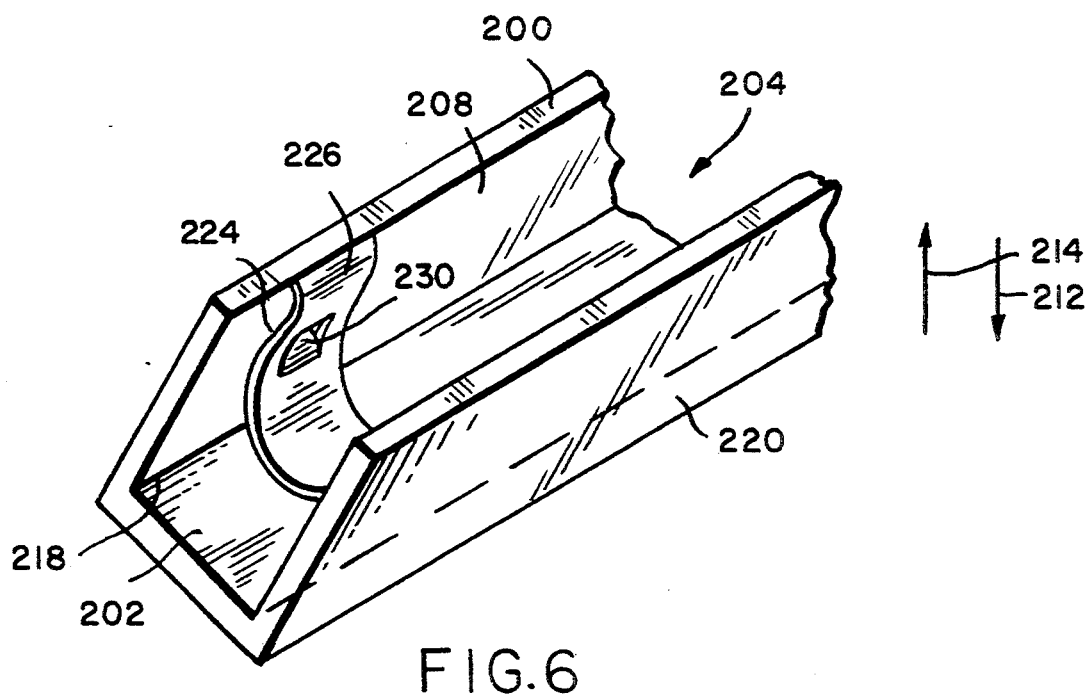
FIG. 6 is a perspective view of a third embodiment of an intermediate member of the present invention.
Figure 7:
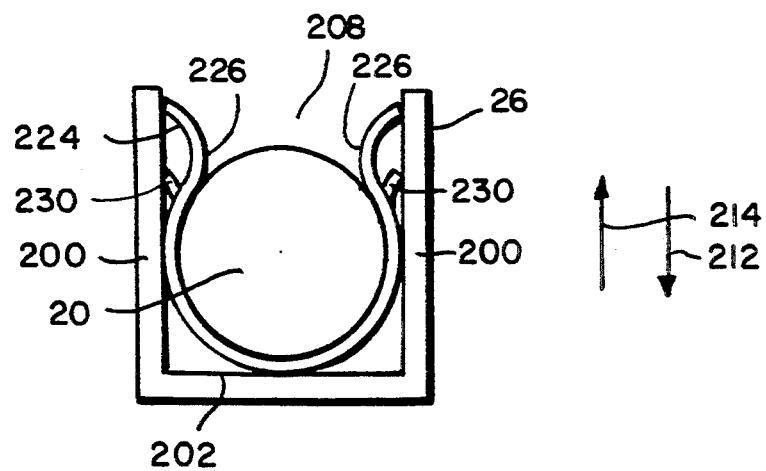
FIG. 7 is an end view of the embodiment of FIG. 6.

The slideable members 26, 28 and 30 include a longitudinal entrance 208 and an inhibiting means, which differs for the various embodiments in a manner to be described later, for permitting movement of the rod through the longitudinal entrance only when a force in transverse direction 212 or 214 above a predetermined threshold is applied to the member or the rod. A longitudinal channel entrance facilitates assembly of the retainer in a housing that has previously been mounted to a chassis by permitting the slideable members to be snapped into position on the rod. The threshold of force necessary to press the rod through entrance 208 is determined by the width of the longitudinal entrance in comparison to the outer diameter of the rod and the inherent elasticity of the inhibiting means. In a first and second embodiment, the inhibiting means forms an integral part of the intermediate member (FIGS. 4 and 5), while in a third embodiment, the inhibiting means is an elastic clip that is inserted into the member (FIGS. 6 and 7).

Figure 4:
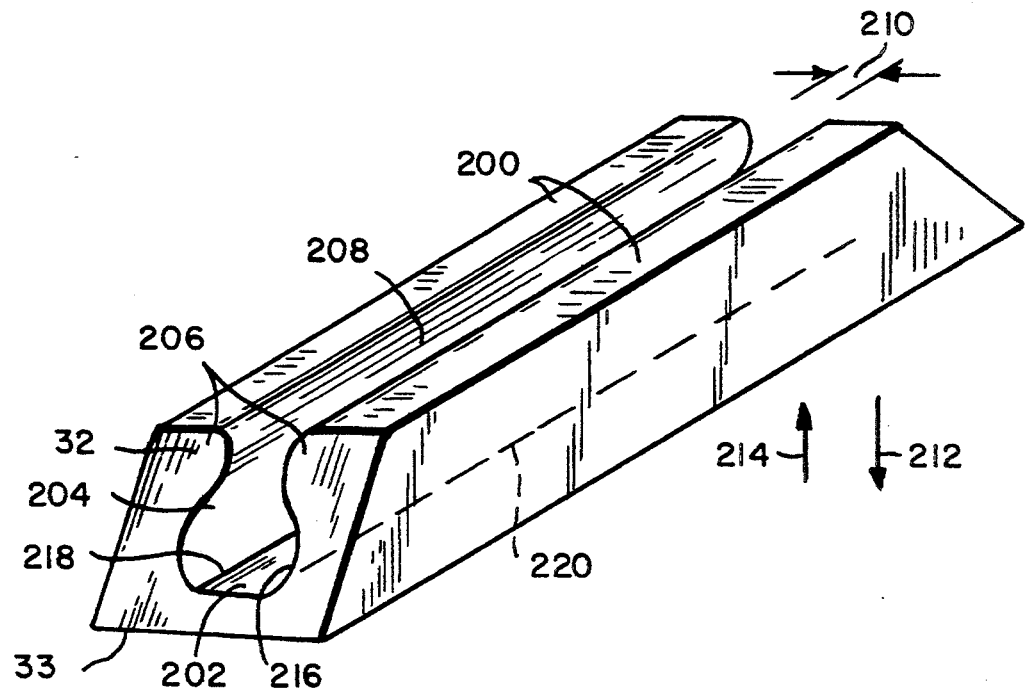
FIG. 4 is a perspective view of a first embodiment of an intermediate member of the present invention.
Figure 5:
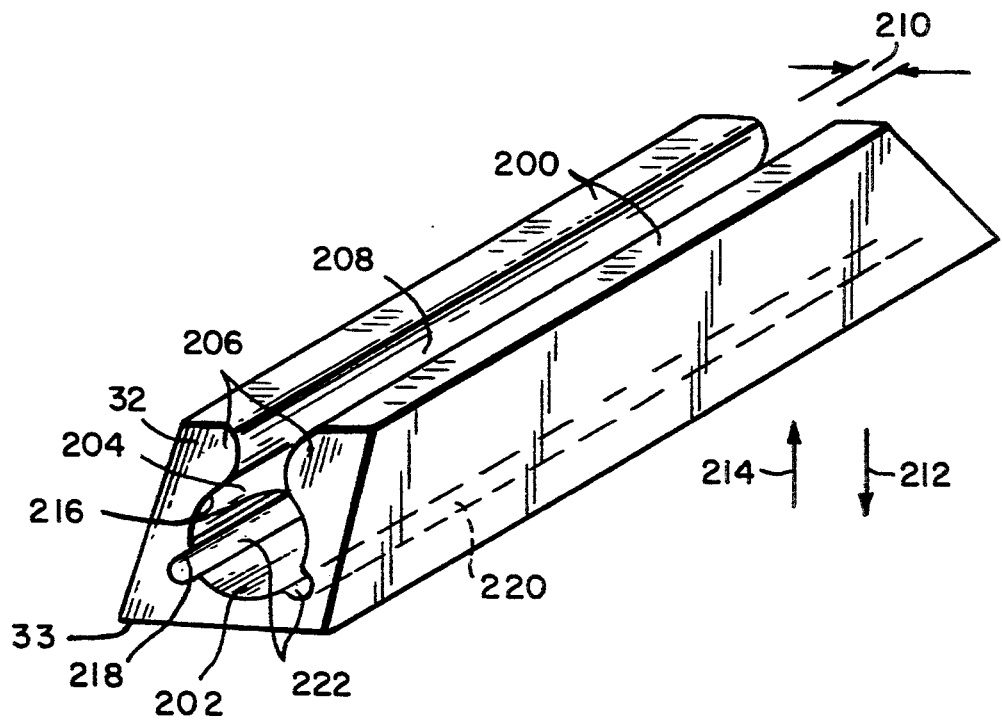
FIG. 5 is a perspective view of a second embodiment of an intermediate member of the present invention.

In the first and second embodiments, opposing channel walls 200 terminate at their upper end in lips 206 which define the longitudinal channel entrance (FIGS. 4 and 5). The lips are spaced apart from one another so that channel entrance 208 has a width 210 which is less than the outer diameter of rod 20. For a slideable member formed of aluminum, width 210 preferably is between 0.001 and 0.002 inches smaller than the outer diameter of the rod.

As described above, the lips of the channel walls permit movement of the rod through longitudinal entrance 208 only when a force above a predetermined threshold is applied to the member or rod in transverse directions 212 or 214. In a preferred embodiment, the slideable members are formed of extruded aluminum and side walls 200 have a thickness ranging from about 0.030 inches to about 0.050 inches. This thickness of aluminum confers sufficient elasticity to the opposing walls to permit assembly of retainer 10 by "snapping" the slideable members onto rod 20, or by pressing the rod through longitudinal entrance 208 into channel 204.

In a preferred embodiment, the slideable members further include integral alignment means for maintaining alignment of the members on the rod. Referring to FIG. 4, the alignment means are embodied in a pair of alignment surfaces 216 which captivate rod 20, thereby maintaining the alignment of the slideable members relative to rod 20 and urging the rod closer to bottom wall 202 and away from longitudinal entrance 208 in a similar manner as the aforementioned leaf springs of the prior art for preventing rotation of the members on the rod. The alignment surfaces do not oppose movement of the rod in transverse direction 212 when the retainer is actuated. By maintaining the alignment of the slideable members relative to the rod, alignment surfaces 216 facilitate initial installation of the circuit board between the spaced surfaces of the housing. As rod 20 is rotated to unscrew rod threads 36 from mating threads 39 (FIGS. 1 and 2), the captivating action of alignment surfaces 216 acts to maintain alignment of the intermediate and end members relative to one another by preventing rotation of these members on the rod.

In the second embodiment (FIG. 5), a pair of longitudinal grooves 222 are formed at junctions 218 and 220. By reducing the wall section at the junctions, the amount of force necessary to insert rod 20 through longitudinal entrance 208 is reduced in comparison with the amount of force necessary to insert the rod through the longitudinal entrance of a member which does not have a reduced wall section, e.g., the first embodiment as shown in FIG. 4. In addition, the reduced wall section allows intermediate members 26, 28 and 30 to be fabricated with greater tolerances in comparison with the first embodiment. Thus, for a slideable member formed of aluminum and having the above-described dimensions, the width of longitudinal entrance 208 for the embodiment shown in FIG. 5 may range from between 0.002 to 0.005 inches smaller than the outer diameter of rod 20.

A third embodiment of a slideable member is illustrated in FIGS. 6 and 7. The third embodiment includes at least one pair of mounting clips 224 for insertion into channel 204, between opposing channel walls 200. Each mounting clip includes a pair of lock detents 230 for retaining the clip in internal channel 204. Mounting clips 224 further include a pair of facing tabs 226 which, after insertion into the internal channel, are separated by a distance that is less than the outer diameter of the rod (FIG. 7). However, because the mounting clips are formed of an elastic material, e.g., aluminum, tabs 226 have sufficient elasticity to permit insertion of the rod between facing tabs 226 only when a force in transverse direction 212 or 214 above a predetermined threshold is applied to the rod. As previously described, the threshold of force necessary to move the rod between facing tabs 226 is a function of the thickness of clips 224 and the inherent elasticity of the material from which the mounting clips is fabricated.

Although retainers employing a total of three or five members are disclosed herein, retainers different numbers of members are also contemplated, depending upon the length of the circuit board to be mounted.

Having described the invention in detail, those skilled in the art will appreciate that numerous modifications can be made therein without departing from its spirit. Therefore, it is not intended to limit the breadth of the invention to the embodiments illustrated and described. Rather, the scope of this invention is to be determined by the appended claims and their equivalents.

What is claimed is:

1. In a retainer for holding a circuit board between spaced surfaces, the retainer having a plurality of slideable members mounted end-to-end on a rod which has a selected outer diameter, at least one of said members comprising:

first and second continuous side walls attached to a bottom wall at first and second junctions respectively, said walls defining an internal channel having a transverse dimension greater than the outer diameter of the rod;

a longitudinal channel entrance; and inhibiting means for permitting movement of the rod through said longitudinal channel entrance only when relative forces above a predetermined threshold are applied to at least one of the rod and the member, the relative forces being in a first direction to mount the member on the rod and being in a direction substantially opposite said first direction to remove the member from the rod.

2. A member as claimed in claim 1, wherein said inhibiting means is integral therewith.

3. A member as claimed in claim 2, wherein said side walls include lips defining said longitudinal channel entrance, said channel entrance having a width less than the outer diameter of the rod, said side walls having sufficient elasticity to permit movement of the rod between said lips only when said relative forces above the predetermined threshold is applied.

4. A member as claimed in claim 3, wherein said one member has a selected thickness at said first and second junctions, and includes means for reducing the thickness of said one member at each of said first and second junctions.

5. A member as claimed in claim 4, wherein said means for reducing the thickness is a pair of longitudinal grooves formed at said first and second junctions.

6. A member as claimed in claim 1, said one member further including alignment means for maintaining alignment of said one member on said rod.

7. A member as claimed in claim 1, wherein said inhibiting means is removable from said member.

8. A member as claimed in claim 7, wherein a top portion of said side walls define said longitudinal channel entrance; a pair of mounting clips for insertion into said longitudinal channel between said first and second side walls, each clip having a pair of facing tabs extending into said longitudinal channel entrance, the distance between said facing tabs being less than the outer diameter of said rod, said tabs having sufficient elasticity to permit movement of said rod between said tabs only when said relative forces above the predetermined threshold is applied.

9. A retainer for holding a circuit board between spaced surfaces, comprising:

a rod having a selected outer diameter;

a plurality of slideable members mounted end-to-end on said rod, at least one of said members including first and second continuous side walls attached to a bottom wall at first and second junctions respectively, said walls defining an internal channel having a transverse dimension greater than the outer diameter of the rod, a longitudinal channel entrance, and inhibiting means for permitting movement of the rod through said longitudinal channel entrance only when relative forces above a predetermined threshold are applied to at least one of the rod and the member, the relative forces being in a first direction to mount the member on the rod and being in a direction substantially opposite said first direction to remove the member from the rod; and means for forcing adjacent slideable members toward said one member.

10. A retainer as claimed in claim 9, wherein said inhibiting means is integral with said one member.

11. A retainer as claimed in claim 10, wherein said side walls include lips defining said longitudinal channel entrance, said channel entrance having a width less than the outer diameter of the rod, said side walls having sufficient elasticity to permit movement of the rod between said lips only when said relative forces above the predetermined threshold is applied.

12. A retainer as claimed in claim 11, wherein said one member has a selected thickness at said first and second junctions, and includes means for reducing the thickness of said one member at each of said first and second junctions.

13. A retainer as claimed in claim 12, wherein said means for reducing the thickness is a pair of longitudinal grooves formed at said first and second junctions.

14. A retainer as claimed in claim 9, said one member further including alignment means for maintaining alignment of said one member on said rod.

15. A retainer as claimed in claim 9, wherein said inhibiting means is removable from said member.

16. A retainer as claimed in claim 15, wherein said one member includes; a top portion of said side walls defining said longitudinal channel entrance; a pair of mounting clips for insertion into said longitudinal channel between said first and second side walls, each clip having a pair of facing tabs extending into said longitudinal channel entrance, the distance between said facing tabs being less than the outer diameter of said rod, said tabs having sufficient elasticity to permit movement of said rod between said tabs only when said relative forces above the predetermined threshold is applied.

* * * * *